United States Patent
Bellato et al.

(10) Patent No.: US 10,865,702 B2
(45) Date of Patent: Dec. 15, 2020

(54) INTERCOOLER PROVIDED WITH A THERMOELECTRIC GENERATOR FOR A TURBOCHARGED INTERNAL COMBUSTION HEAT ENGINE

(71) Applicant: MARELLI EUROPE S.p.A.

(72) Inventors: Nazario Bellato, Bologna (IT); Mihai-Claudiu Popan, Gherla (RO)

(73) Assignee: MARELLI EUROPE S.p.A., Corbetta (IT)

(*) Notice: Subject to any disclaimer, the term of this patent is extended or adjusted under 35 U.S.C. 154(b) by 16 days.

(21) Appl. No.: 16/226,083

(22) Filed: Dec. 19, 2018

(65) Prior Publication Data

US 2019/0186347 A1   Jun. 20, 2019

(30) Foreign Application Priority Data

Dec. 20, 2017 (IT) .................. 102017000147426

(51) Int. Cl.
*F02B 29/04* (2006.01)
*F02M 31/20* (2006.01)
(Continued)

(52) U.S. Cl.
CPC ...... *F02B 29/0481* (2013.01); *F02B 29/0443* (2013.01); *F02B 29/0462* (2013.01);
(Continued)

(58) Field of Classification Search
CPC ...... F02B 29/0481; H01L 35/28; H01L 35/30; H01L 35/32
See application file for complete search history.

(56) References Cited

U.S. PATENT DOCUMENTS 3,077,080 A * 2/1963 Pietsch ............... F24F 5/0042
                                                                 62/3.3
3,138,934 A * 6/1964 Roane ................ G05D 23/1919
                                                                 62/3.3
(Continued)

FOREIGN PATENT DOCUMENTS

DE            19954690 A1 *  5/2001  .......... F02B 29/0456
DE        102008051843 A1     4/2010
(Continued)

OTHER PUBLICATIONS

Search Report for Italian Patent Application No. 201700147426 dated Oct. 2, 2018.

*Primary Examiner* — Jesse S Bogue
(74) *Attorney, Agent, or Firm* — Howard & Howard Attorneys PLLC (57) ABSTRACT

An intercooler for a turbocharged internal combustion heat engine; the intercooler has: a cooling chamber, which is provided with an air inlet opening and an air outlet opening opposite one another; a plurality of exchanger plates, which are stacked on top of one another inside the cooling chamber, are arranged parallel to an air flowing direction from the inlet opening to the outlet opening, are spaced apart from one another so as to define corresponding air passage channels between one another, and are internally hollow; a circulation circuit, which allows a cooling fluid to circulate inside the exchanger plates; and a plurality of thermoelectric cells, each of which is mounted on a corresponding exchanger plate, and has a cold side resting on the exchanger plate and a hot side delimiting a corresponding air passage channel.

10 Claims, 9 Drawing Sheets

(51) Int. Cl.
    *H01L 35/32*     (2006.01)
    *F02G 5/00*     (2006.01)
    *H01L 35/30*     (2006.01)

(52) U.S. Cl.
    CPC ............... *F02G 5/00* (2013.01); *F02M 31/20* (2013.01); *H01L 35/30* (2013.01); *H01L 35/32* (2013.01)

(56) References Cited

U.S. PATENT DOCUMENTS

| | | | |
|---|---|---|---|
| 5,547,019 A | 8/1996 | Iacullo | |
| 7,171,955 B2* | 2/2007 | Perkins | F02B 29/0418 123/41.1 |
| 9,281,462 B2* | 3/2016 | Bartl | H01L 35/28 |
| 9,735,333 B2* | 8/2017 | Himmer | H01L 35/32 |
| 9,806,389 B2* | 10/2017 | Grunwald | F28F 3/08 |
| 2006/0118157 A1* | 6/2006 | Johnson | B82Y 10/00 136/205 |
| 2008/0308140 A1* | 12/2008 | Nakamura | H01L 35/32 136/200 |
| 2009/0025772 A1* | 1/2009 | Dannoux | F01N 5/025 136/205 |
| 2010/0243016 A1* | 9/2010 | Awashima | F01K 25/10 136/205 |
| 2011/0083831 A1 | 4/2011 | Richter et al. | |
| 2012/0247526 A1* | 10/2012 | Okuda | H01L 35/30 136/225 |
| 2012/0325280 A1* | 12/2012 | Akiyama | H01L 35/32 136/200 |
| 2014/0060605 A1* | 3/2014 | Angermann | H01L 35/30 136/224 |
| 2014/0305481 A1 | 10/2014 | Brandenburg et al. | |
| 2014/0345662 A1* | 11/2014 | Gauss | F01N 1/083 136/205 |
| 2015/0128590 A1 | 5/2015 | Engineer et al. | |
| 2015/0325766 A1* | 11/2015 | Himmer | H01L 35/32 136/205 |
| 2016/0155922 A1 | 6/2016 | Lang et al. | |
| 2018/0166621 A1* | 6/2018 | Ranalli | H01M 10/625 |
| 2019/0088845 A1* | 3/2019 | Sugi | H01L 35/32 |
| 2019/0195110 A1* | 6/2019 | Hermida Dom Nguez | F01N 5/025 |
| 2020/0081464 A1* | 3/2020 | Balma | H01L 23/38 |

FOREIGN PATENT DOCUMENTS

| | | | |
|---|---|---|---|
| DE | 102009046318 A1 * | 5/2011 | ............. H01L 35/30 |
| DE | 102012206127 A1 * | 10/2013 | ........... H01L 35/325 |
| DE | 102012217215 A1 | 6/2014 | |
| EP | 2765285 A1 | 8/2014 | |
| JP | 2016158424 A * | 9/2016 | ............. F28D 9/005 |
| WO | 2011107282 A1 | 9/2011 | |

* cited by examiner

INTERCOOLER PROVIDED WITH A THERMOELECTRIC GENERATOR FOR A TURBOCHARGED INTERNAL COMBUSTION HEAT ENGINE

CROSS-REFERENCE TO RELATED APPLICATIONS

This Patent application claims priority from Italian Patent Application No. 102017000147426 filed on Dec. 20, 2017, the disclosure of which is incorporated by reference.

TECHNICAL FIELD

The present invention relates to an intercooler provided with a thermoelectric generator (also called "TEG") for a turbocharged internal combustion heat engine.

PRIOR ART

In an internal combustion heat engine, 75% of the energy produced during combustion is lost in the exhaust or in the coolant in the form of heat.

In the constant effort to increase the energy efficiency of internal heat engines, it has recently been proposed to use part of the heat of the exhaust gases (which would otherwise be completely dispersed into the atmosphere through the exhaust system) to generate electrical energy through the use of thermoelectric cells.

A solid-state thermoelectric cell is able to convert heat into electrical energy (through the Seebeck, Peltier and Thomson effect) when there is a difference in temperature between its hot side and its cold side; in order to ensure effective generation of electrical energy, it is necessary to ensure that the temperature of the cold side of the thermoelectric cell remains sufficiently lower than the temperature of the hot side, and it is therefore necessary to provide constant cooling of the cold side.

It has therefore been proposed to arrange, along the exhaust system, a thermoelectric generator provided with a plurality of solid-state thermoelectric cells, each having a hot side that is exposed to the exhaust gases and heated by the exhaust gases themselves (which may have a temperature of 250-750° C. depending on the area of the exhaust system in which the thermoelectric generator is arranged) and a cold side (opposite the hot side) that is constantly cooled by a cooling fluid (which is maintained strictly separated from the exhaust gases and generally consists of water that transfers heat to the external environment also by circulating through a radiator).

By way of example, patent applications WO2011107282 US2011083831A1, EP2765285A1, US2014305481A1, US2015128590A1, and US2016155922A1 disclose thermoelectric generators for an exhaust system of an internal combustion engine.

The integration of a thermoelectric generator along the exhaust system allows the overall energy efficiency of the internal combustion engine to be increased; however, on the other hand, the integration of a thermoelectric generator along the exhaust system has several drawbacks as it significantly increases the cost (both because of the need to purchase special thermoelectric cells capable of withstanding the high temperatures of the exhaust gases and the chemical attack by the substances in the exhaust gases, and the need to create a liquid cooling system not otherwise present in the exhaust system), the overall dimensions and the weight (essentially due to the need to create a liquid cooling system not otherwise present in the exhaust system).

Patent applications DE102008051843A1 and DE102012217215A1 describe an intercooler provided with a thermoelectric generator for a turbocharged internal combustion heat engine; in particular, the intercooler comprises a plurality of thermoelectric cells, each having a cold side resting on an exchanger plate, which is internally run through by a cooling fluid, and a hot side licked by the air sucked in.

DESCRIPTION OF THE INVENTION

The object of the present invention is to provide an intercooler provided with a thermoelectric generator for a turbocharged internal combustion heat engine, which intercooler allows the overall energy efficiency of the internal combustion engine to be increased, and at the same time is easy and inexpensive to manufacture.

According to the present invention, an intercooler provided with a thermoelectric generator for a turbocharged internal combustion heat engine is provided, as claimed in the appended claims.

The claims describe preferred embodiments of the present invention forming an integral part of the present specification.

BRIEF DESCRIPTION OF THE DRAWINGS

The present invention will now be described with reference to the accompanying drawings, which illustrate a non-limiting embodiment thereof, in which.

PREFERRED EMBODIMENTS OF THE INVENTION

Figure 1:
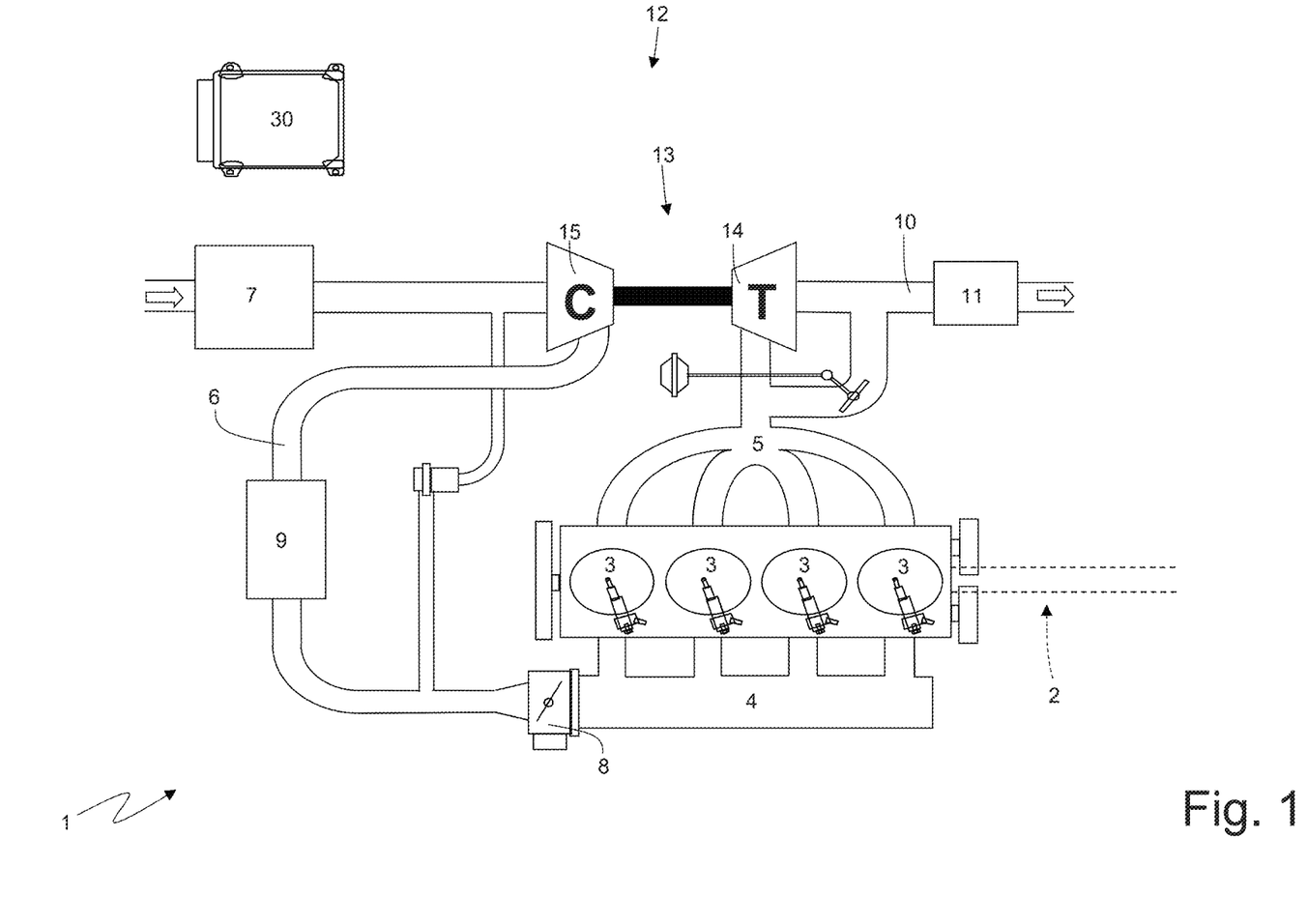
FIG. 1 is a schematic view of a turbocharged internal combustion heat engine provided with an intercooler manufactured in accordance with the present invention.

In FIG. 1, number 1 indicates as a whole an internal combustion heat engine, which is provided with a drive shaft 2 for transmitting motion to the drive wheels of a vehicle.

The internal combustion heat engine 1 comprises four cylinders 3, each of which is connected to an intake manifold 4 via at least one respective intake valve (not shown) and to an exhaust manifold 5 via at least one respective exhaust valve (not shown). Each cylinder 3 houses, on the inside, a respective piston that slides with reciprocating motion and is mechanically connected to the drive shaft 2; moreover, each cylinder 3 is provided with its own injector which injects the fuel directly inside the cylinder 3. The intake manifold 4 receives fresh air (i.e. air from the external environment) through an intake pipe 6, which is provided with an air filter 7 and is controlled by a throttle valve 8 (i.e. the throttle valve 8 adjusts the flow rate of fresh air fed by the intake pipe 6 to the intake manifold 4). An intercooler 9 (i.e. a water-air heat exchanger), whose function is to cool the intake air so as to feed the air into the cylinders 3 at the optimal temperature for combustion, is arranged along the intake pipe 6. The exhaust manifold 5 is connected to an exhaust pipe 10 that feeds the exhaust gases produced by combustion to an exhaust system, which emits the gases produced by combustion into the atmosphere and normally comprises at least one catalyst 11 and at least one silencer (not shown) arranged downstream of the catalyst 11.

The internal combustion heat engine 1 is supercharged by a turbocharger supercharging system 12 comprising a turbocharger 13 provided with a turbine 14, which is arranged along the exhaust pipe 10 so as to rotate at high speed under the thrust of the exhaust gases expelled by the cylinders 3, and a compressor 15, which is rotated by the turbine 14 and arranged along the intake pipe 6 (upstream of the intercooler 9) so as to increase the pressure of the air fed by the intake pipe 6. According to a possible embodiment, not shown, the supercharging system 12 may also comprise an electric machine, which is mechanically connected to the shaft of the turbocharger 13 (i.e. is mechanically connected to the turbine 14 and the compressor 15) and reversible (i.e. it can be operated as an electric motor to absorb electrical energy and produce a mechanical torque or as an electrical generator to absorb mechanical energy and produce electrical energy).

Figure 2:
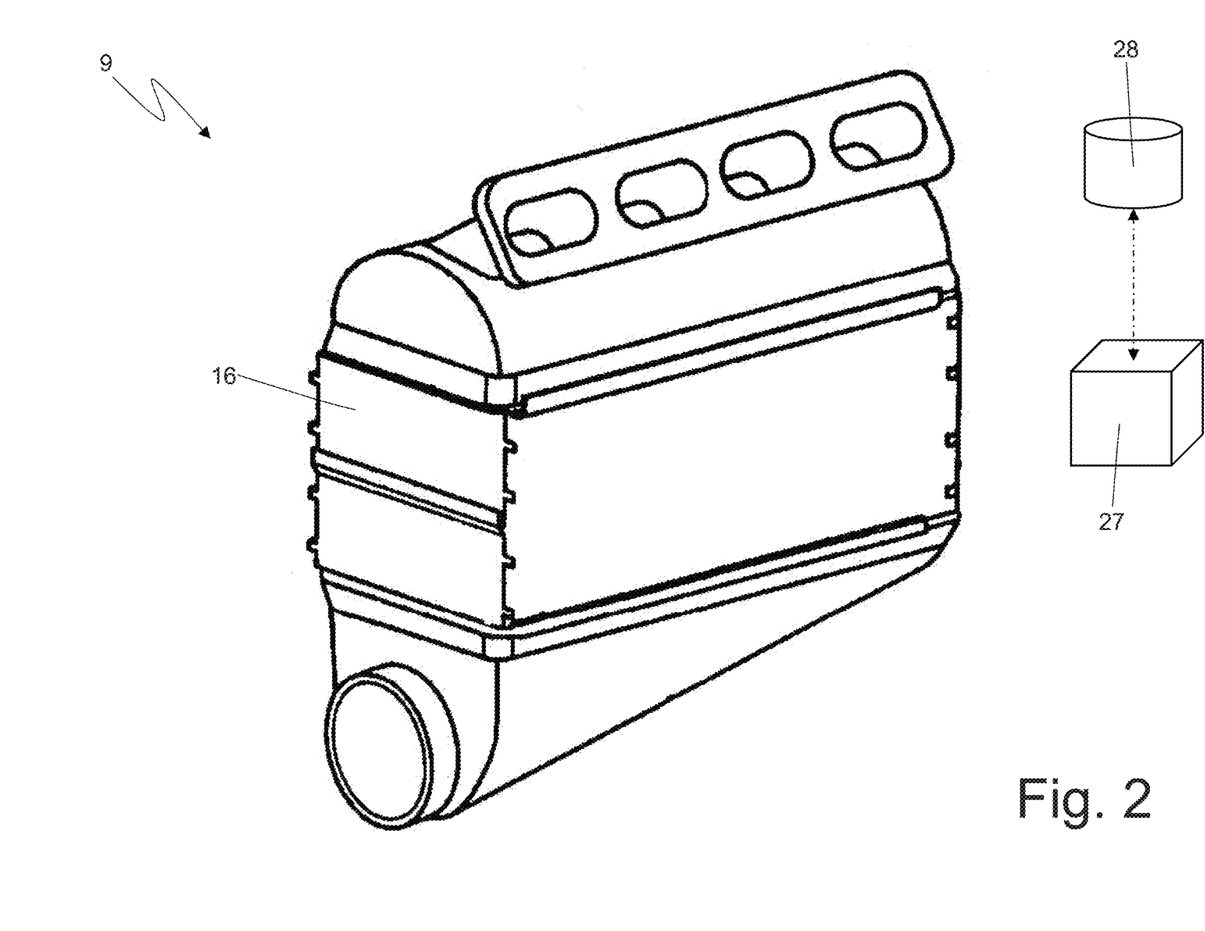
FIG. 2 is a perspective view of the intercooler in FIG. 1 integrated with an intake manifold.
Figure 3:
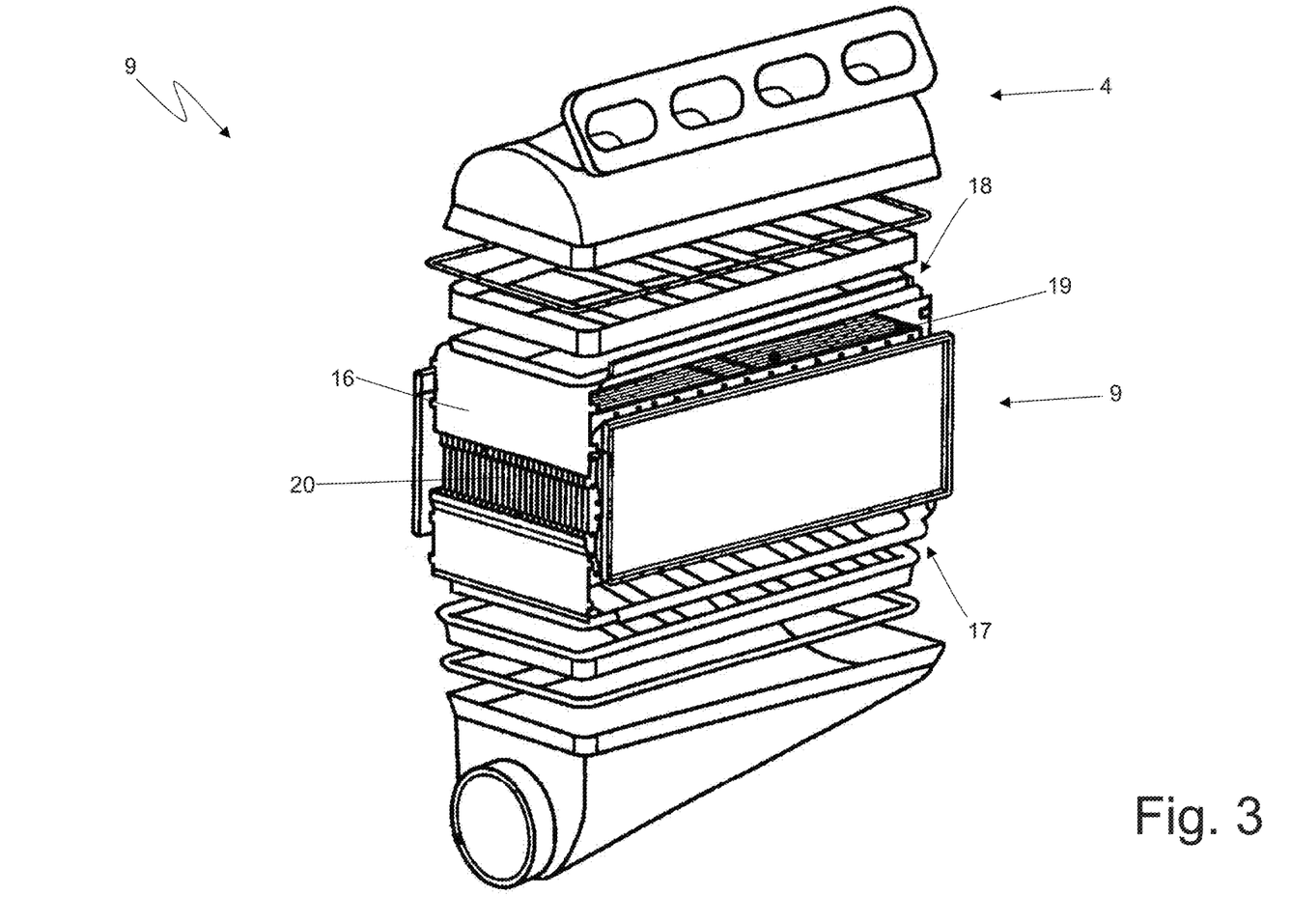
FIG. 3 is an exploded perspective view of the intercooler in FIG. 1.

As shown in FIGS. 2 and 3, the intercooler 9 is integrated with the intake manifold 4 (i.e., it forms a single body with the intake manifold 4) and comprises a parallelepipedal box-like body 16 having an air inlet opening 17 and an air outlet opening 18, opposite and facing each other (i.e. the inlet opening 17 and the outlet opening 18 are formed through opposite and parallel walls of the box-like body 16). A cooling chamber 19 is defined inside the box-like body 16, the former being delimited on two opposite sides by the openings 17 and 18 and, in use, run through by a flow of air coming from the compressor 15 of the turbocharger 13 and directed toward the intake manifold 4.

Figure 4:
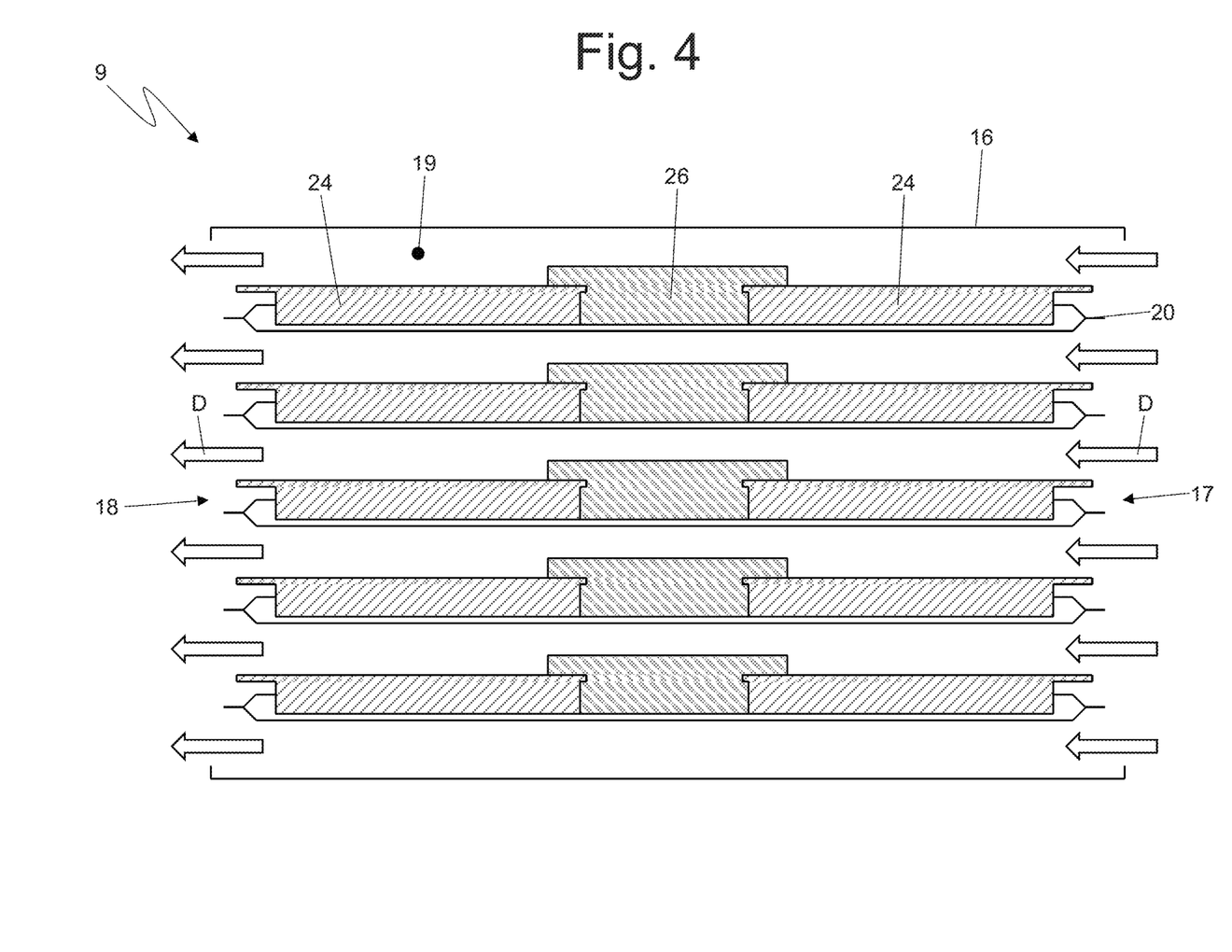
FIG. 4 is a schematic longitudinal section view of a portion of the intercooler in FIG. 1.

As better shown in FIG. 4, the intercooler 9 comprises a plurality of exchanger plates 20, which are stacked on top of one another inside the cooling chamber 19, are arranged parallel to an air flowing direction D from the inlet opening 17 to the outlet opening 18, are spaced apart from one another so as to define corresponding air passage channels between one another, and are internally hollow (that is, internally they have at least one channel, one chamber).

Figure 5:
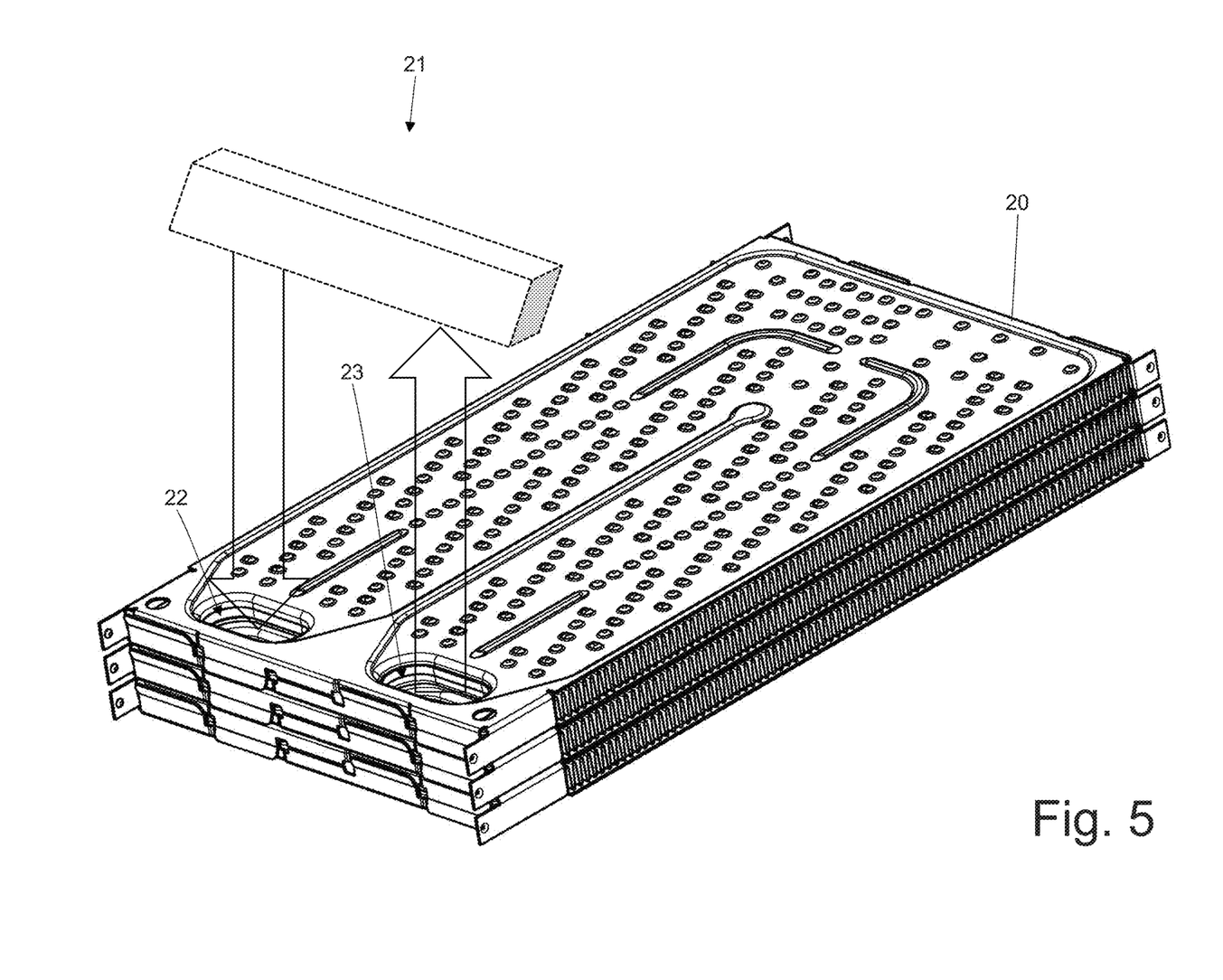
FIG. 5 is a perspective view of some exchanger plates of the intercooler in FIG. 1.

As shown in FIG. 5, the intercooler 9 comprises a circulation circuit 21, which allows a cooling fluid (typically water, optionally added with anti-freeze additives and/or anti-corrosion additives) to circulate inside the exchanger plates 20 (i.e. within the channels or chambers formed on the inside of the exchanger plates 20). A circulation path for the cooling fluid, extending between an inlet opening 22 and an outlet opening 23, is defined inside each exchanger plate 20. The openings 22 and 23 of all the exchanger plates 20 are mutually aligned and superimposed so as to define respective channels that are connected to the remaining part of the circulation circuit 21, which is arranged outside the box-like body 16 (i.e. the cooling chamber 19) and generally comprising a circulation pump and a radiator (i.e. an air-water heat exchanger).

As shown in FIG. 4, the intercooler 9 comprises a plurality of solid-state thermoelectric cells 24, each of which has a substantially parallelepiped shape, is mounted on a corresponding exchanger plate 20, and has a cold side resting on the exchanger plate 20 and a hot side delimiting a corresponding air passage channel. Each thermoelectric cell 24 is able to convert heat into electrical energy (through the Seebeck, Peltier and Thomson effect) when there is a difference in temperature between its own hot side and its own cold side; in order to ensure effective generation of electrical energy, it is necessary to ensure that the temperature of the cold side of each thermoelectric cell 24 remains sufficiently lower than the temperature of the hot side, and it is therefore necessary to provide both constant heating to the hot side (through the intake air heated by the compressor 15 of the turbocharger 13), and constant cooling to the cold side (through the circulation of the cooling fluid inside the exchanger plates 20).

The group of all the thermoelectric cells 24 constitutes a thermoelectric generator (i.e. a device that is able to convert part of the heat of the air into electrical energy and is also called "TEG").

Figure 6:
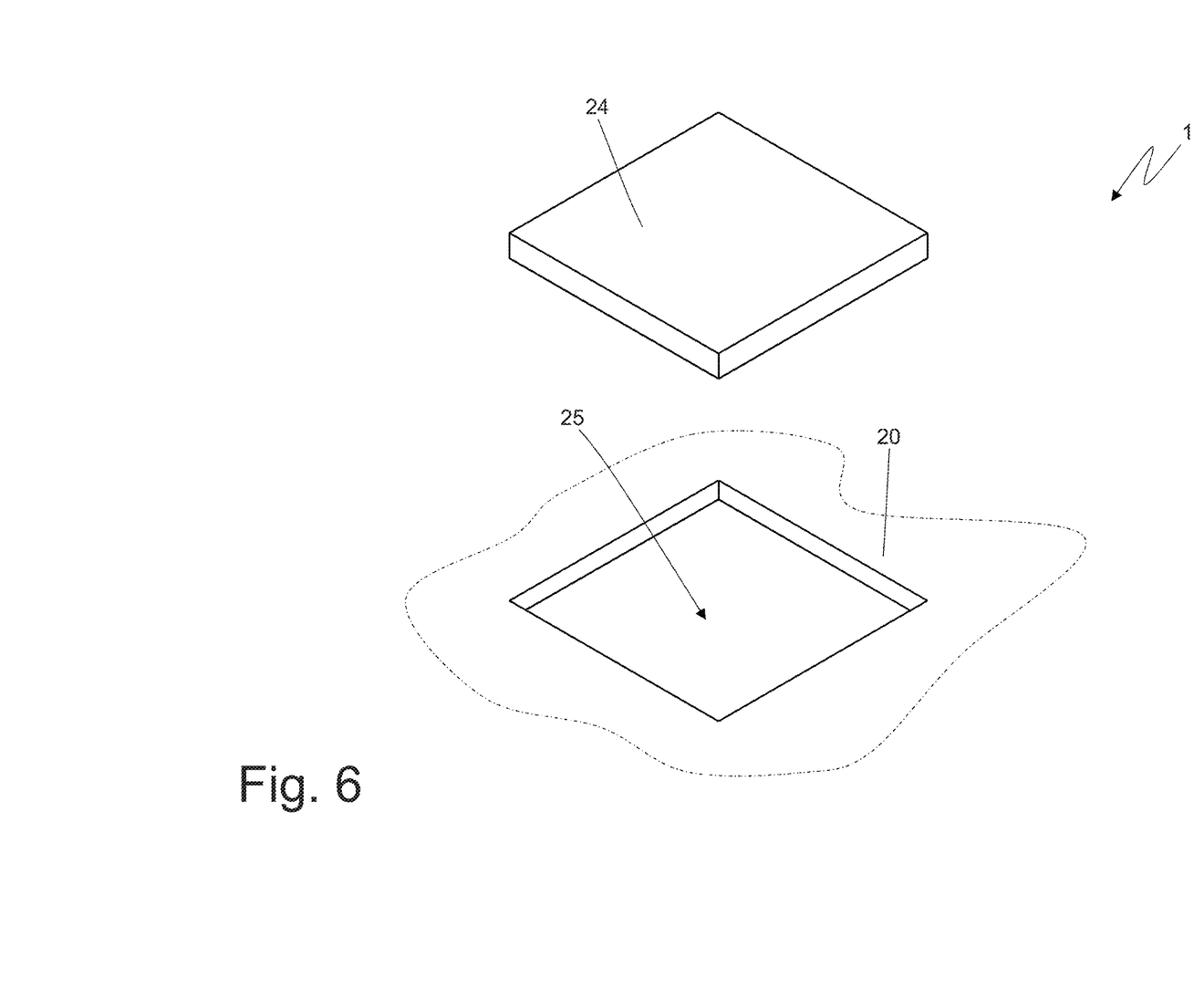
FIG. 6 is a perspective view of a pocket and of a corresponding thermoelectric cell of an exchanger plate of FIG. 5.

As shown in FIG. 6, each exchanger plate 20 comprises a plurality of pockets 25 (in particular, eight pockets 25), each of which has a parallelepiped shape, reproduces in negative the shape of a corresponding thermoelectric cell 24, and houses therein the thermoelectric cell 24, surrounding said thermoelectric cell 24 on five sides. In other words, each exchanger plate 20 comprises a plurality of seats, parallelepipedal cavities (i.e. the pockets 25), which reproduce in negative the shape of the thermoelectric cells 24 and house said thermoelectric cells 24. In particular, each pocket 25 has a rectangular-shaped bottom wall which is arranged in direct contact with the cold side of the corresponding thermoelectric cell 24 and a side wall, which projects perpendicularly from the bottom wall, surrounds the bottom wall on the four sides, and is arranged in direct contact with a side wall of the corresponding thermoelectric cell 24; in this way, each pocket 25 surrounds the corresponding thermoelectric cell 24 on five sides. The hot side of each thermoelectric cell 24 is allowed to be hit by the flow of hot air (to be cooled down) coming from the compressor 15 of the turbocharger 13, whereas the cold side of each thermoelectric cell 24 is located inside a corresponding pocket 25 and rests on a wall of the exchanger plate 20.

According to a preferred embodiment, each pocket 25 has a depth equal to a thickness of the corresponding thermoelectric cell 24 so that the side wall of the thermoelectric cell 24 is completely covered by the side wall of the pocket 25 and then in such a way that the hot side of the thermoelectric cell 24 is flush with an external surface of the corresponding exchanger plate 20; i.e. each thermoelectric cell 24 does not protrude from the external surface of the corresponding exchanger plate 20, but is perfectly flush with the external surface of the corresponding exchanger plate 20 (i.e. the hot side of each thermoelectric cell 24 is aligned and coplanar with the external surface of the corresponding exchanger plate 20).

According to a possible and non-limiting embodiment, a sheet of graphite (or other similar material), which is a thermally conductive and easily deformable material (i.e. it is a "soft" material) is interposed between the cold side of each thermoelectric cell 24 and the corresponding wall of the exchanger plate 20 (i.e. the corresponding wall of the pocket 25 formed in the exchanger plate 20); the function of each sheet of graphite is to improve the contact (i.e. to increase the contact surface) between one side of the thermoelectric cell 24 and the corresponding wall of the exchanger plate 20 in order to enhance the heat exchange and evenly fill in any surface irregularities.

Figure 7:
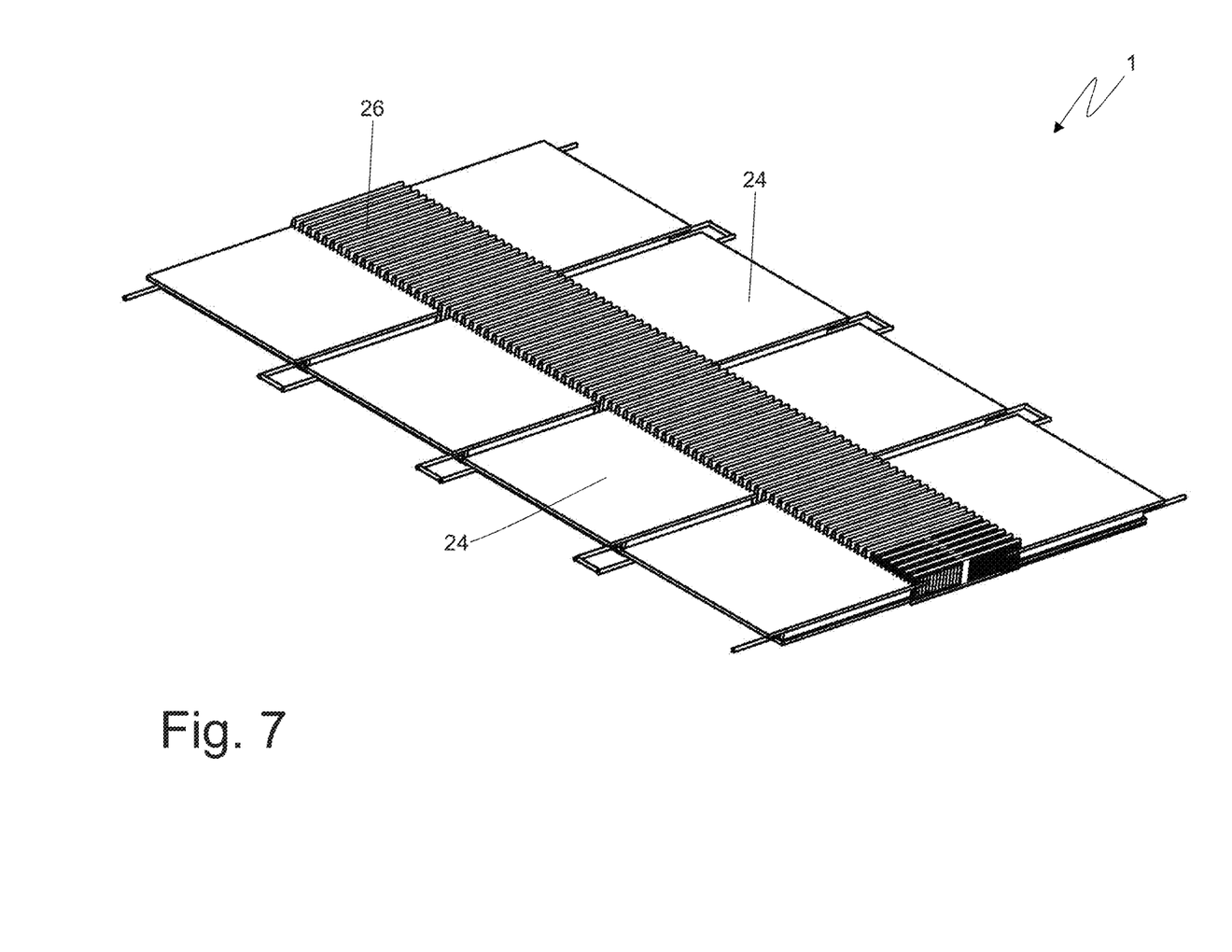
FIGS. 7 and 8 are a top perspective view and a bottom perspective view, respectively, of a group of thermoelectric cells carried by an exchanger plate of FIG. 5.
Figure 8:
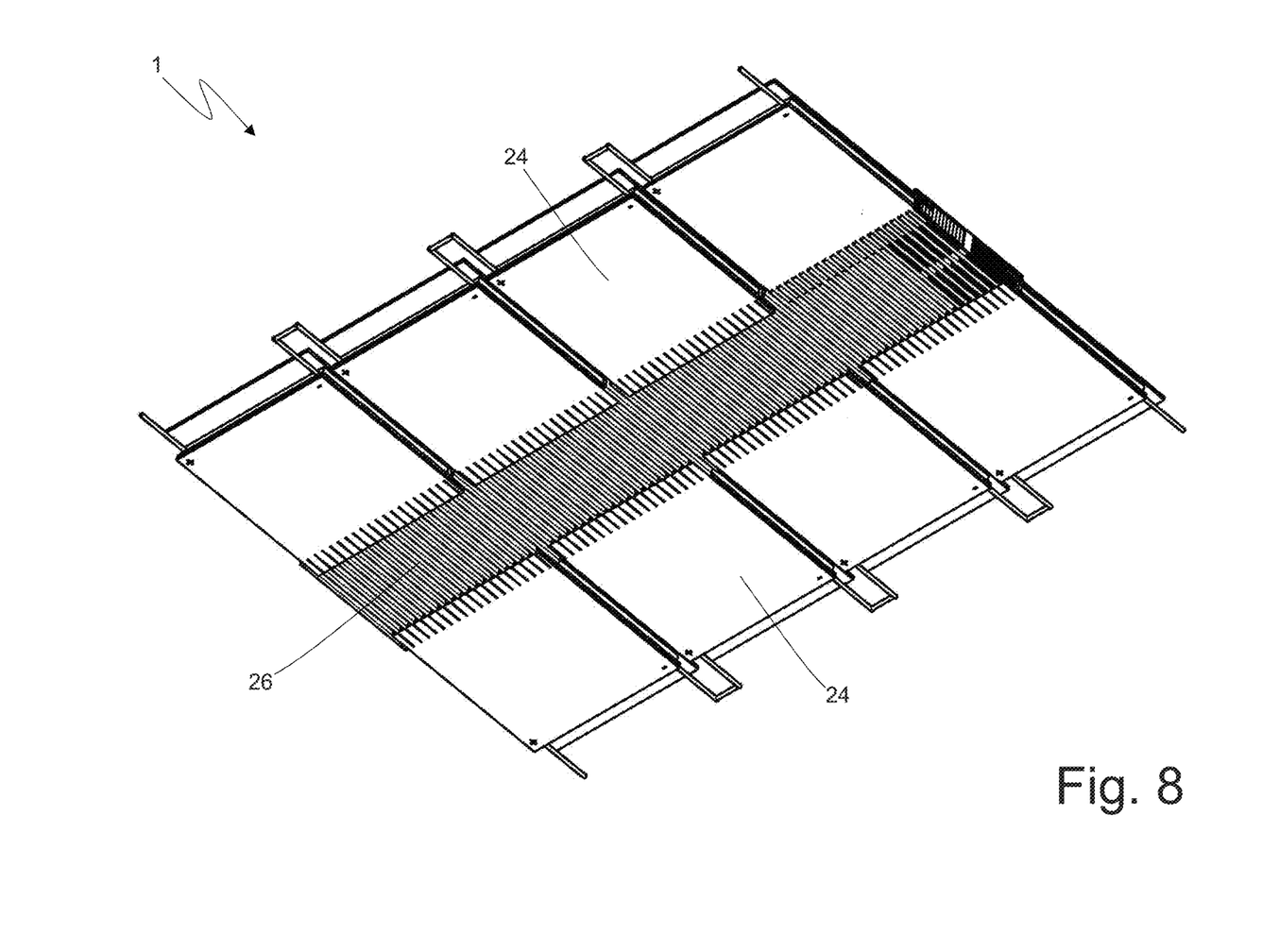

As shown in FIGS. 4, 7 and 8, each exchanger plate 20 comprises two rows of thermoelectric cells 24 (in particular, two rows of four thermoelectric cells 24 each) and a plurality of fins 26, which are interposed between the rows of thermoelectric cells 24 and are arranged parallel to the air flowing direction D from the inlet opening 17 to the outlet opening 18. The function of the fins 26 arranged centrally (i.e. between the two rows of thermoelectric cells 24) is to increase the heat exchange surface of each exchanger plate 20 that is licked by the air passing through the cooling chamber 19 so as to make the cooling of the air more effective. A further function of the fins 26 arranged centrally (i.e. between the two rows of thermoelectric cells 24) is to space the thermoelectric cells 24 of a row away from the thermoelectric cells 24 of the other row so that, between the two rows, the thermoelectric cells 24 do not affect each other and in a negative way. In particular, in order to avoid reciprocal and negative influences between the thermoelectric cells 24 of the two rows, the extent of the fins 26 along the air flowing direction D must be at least 70-80% of the extent of the thermoelectric cells 24 in the same air flowing direction D.

According to a preferred embodiment better illustrated in FIG. 8, in each exchanger plate 20 the four thermoelectric cells 24 of a same row are electrically interconnected in series. The groups of four thermoelectric cells 24 electrically interconnected in series can in turn be connected together in series and/or in parallel.

The intercooler 9 comprises an electronic DC-DC converter 27 (shown schematically in FIG. 2) which is arranged outside the cooling chamber 19 (i.e. outside the box-like body 16). The electronic DC-DC converter 27, at the input, is connected to an electrical circuit connecting all the thermoelectric cells 24 and, at the output, provides an electric voltage that is always constant and equal to a predetermined nominal value (for example 12. Volts for charging a battery of a vehicle equipped with the internal combustion heat engine 1). The voltage entering the electronic DC-DC converter 27 (i.e. the voltage supplied by the thermoelectric generator constituted by the thermoelectric cells 24) changes continuously as the instantaneous air temperature from the compressor 15 of the turbocharger 13 changes, and hence the electronic DC-DC converter 27 must continuously adjust its transformation ratio in order to maintain a constant output voltage (for example equal to 12 Volts).

By way of example, the electronic DC-DC converter 27 may be of the "buck-boost" type; the "buck-boost" converter is a type of DC-DC converter that has a continuous voltage output higher or lower than the input voltage.

Finally, the intercooler 9 comprises an electronic control unit 28, which is connected to the electronic DC-DC converter 27 and controls the electronic DC-DC converter 27 by adjusting the equivalent electrical resistance perceived by the electrical circuit connecting all the thermoelectric cells 24 in order to pursue an optimal equivalent electrical resistance (i.e. an equivalent electrical resistance which allows the energy efficiency of the thermoelectric cells 24 to be maximized, i.e. the overall electrical power generated by the thermoelectric cells 24 to be maximized in all conditions). In the embodiment shown in FIG. 2, the electronic control unit 28 controls the electronic DC-DC converter 27 by adjusting the equivalent electrical resistance perceived by the electrical circuit connecting all the thermoelectric cells 24 so as to pursue an optimal equivalent electrical resistance. According to alternative embodiments, the electronic control unit 28 controls the electronic DC-DC converter 27 by adjusting the equivalent electrical resistance perceived by individual groups of thermoelectric cells 24 (for example by all eight thermoelectric cells 24 of a same exchanger plate 20 or by the four thermoelectric cells 24 of a same row of a same exchanger plate 20) or, in the limit case, by the individual thermoelectric cells 24; in fact, the various thermoelectric cells 24 operate under different conditions (for example, the thermoelectric cells 24 arranged upstream with respect to the air flowing direction D are subjected to a greater temperature shift than the thermoelectric cells 24 arranged downstream with respect to the air flowing direction D, or the thermoelectric cells 24 arranged at the centre of the cooling chamber 19 are subjected to a greater temperature shift than the thermoelectric cells 24 arranged at the edges of the cooling chamber 19), and therefore a differentiated optimization is more effective (but also more complicated) than an overall optimization.

For example, the electronic control unit 28 could control the electronic DC-DC converter 27 by using an MPPT ("Maximum Power Point Tracker") algorithm: the thermoelectric cells 24 have a characteristic voltage/current (or equivalent electrical resistance) curve exhibiting an optimum working point, called "Maximum Power Point", where the maximum possible electrical power can be extracted. This point of the characteristic voltage/current changes continuously according to the temperature shift to which the thermoelectric cells 24 are subjected. Thus, the electronic DC-DC converter 27 must continuously change the equivalent electrical resistance perceived by the electrical circuit connecting all the thermoelectric cells 24 to try to pursue the optimum working point ("Maximum Power Point").

Figure 9:
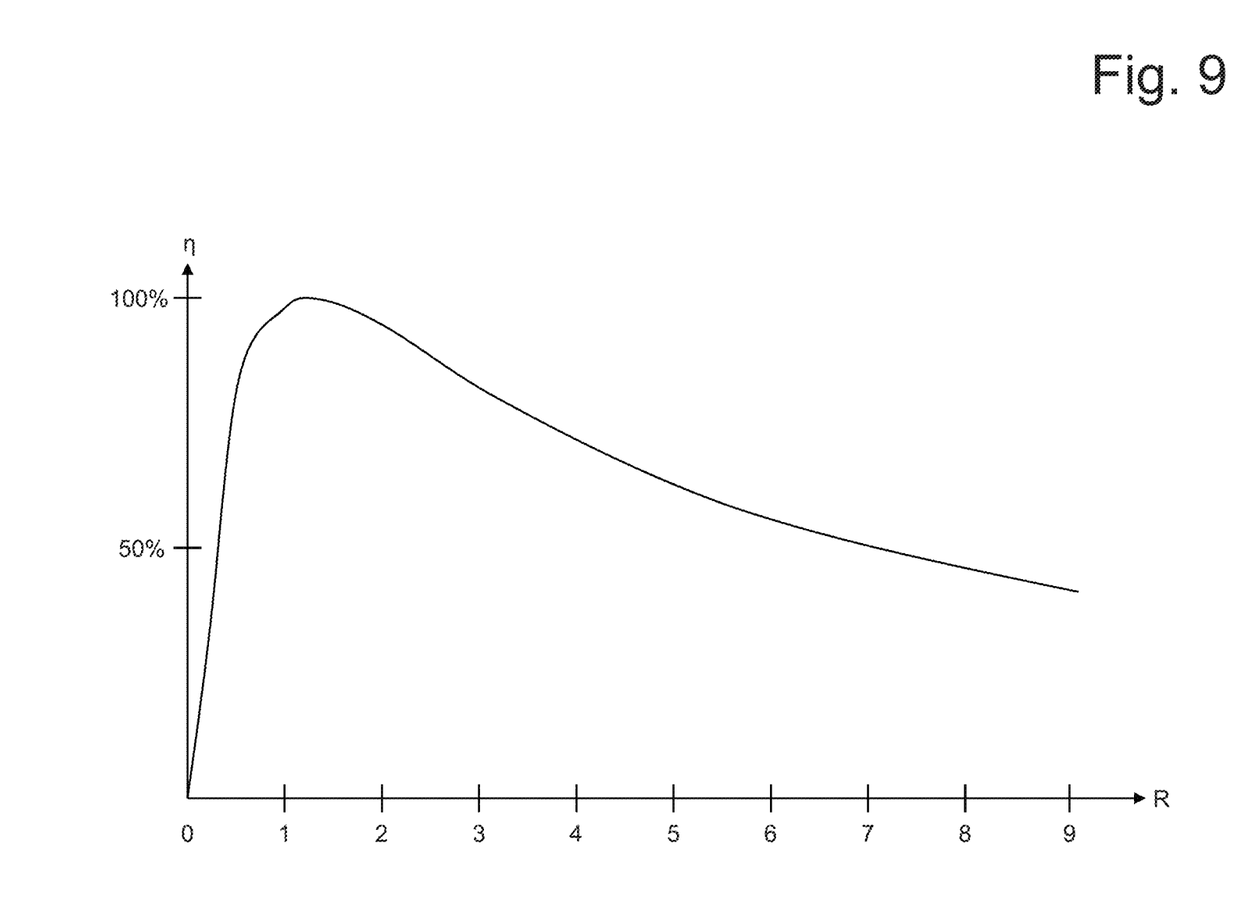
FIG. 9 is a diagram illustrating the performance of the energy efficiency of a thermoelectric cell as the equivalent electrical resistance changes at its terminals.

In other words, the electronic DC-DC converter 27 (controlled by the electronic control unit 28) has the double task of maintaining a constant output voltage (for example 12 Volts) and at the same time changing the input resistance perceived by the thermoelectric generator (i.e. by the electrical circuit connecting all the thermoelectric cells 24) in order to pursue the maximum efficiency working point (i.e. with the maximum generated power). This is because, at the same temperature shift, a thermoelectric cell 24 generates a different electrical power based on the variation of the electrical resistance perceived at its terminals; as shown in the graph of FIG. 9 (in which the abscissa represents the electrical resistance R perceived at the terminals of a thermoelectric cell 24 and the ordinate represents the energy efficiency $\eta$ of the thermoelectric cell 24), at the same temperature shift, the energy efficiency of a thermoelectric cell 24 is maximum when the electrical resistance perceived at its terminals is approximately 0.75-2 Ohms.

Preferably, each exchanger plate 20, together with the corresponding thermoelectric cells 24, is part of a generator module, which is independent and separate from the other generator modules. Preferably, in each generator module, all the thermoelectric cells 24 are interconnected in series and each generator module is provided with its own control electronics, which is able to short-circuit (bypass) any non-functioning (i.e. broken-down) thermoelectric cell 24, as well as to make the terminals of each thermoelectric cell 24 perceive a variable and optimal equivalent electrical resistance, allowing the generation of electrical energy to be maximized by using an MPPT ("Maximum Power Point Tracker") algorithm. In other words, the control electronics of each generator module on the input side (i.e. on the side connected to the two terminals of each thermoelectric cell 24) preferably creates an equivalent electrical resistance such that the voltage between the two terminals of the thermoelectric cell 24 and the electric current flowing through the two terminals of the thermoelectric cell 24 have such values as to optimize the operation of the thermoelectric generator (i.e. to maximize the generation of electrical energy).

By way of example, the intercooler 9 could comprise fifteen exchanger plates 20, each housing eight thermoelectric cells 24 (divided into two rows of four thermoelectric cells 24 each). The nominal electrical power of each thermoelectric cell 24 is approximately 6 Watts and hence altogether the thermoelectric generator has a nominal power of 700 Watts (as there are a total of one hundred and twenty thermoelectric cells 24). A good thermoelectric material has a Seebeck coefficient between 100 µV/K and 300 µV/K, therefore, to obtain a few volts at the output of the thermoelectric generator (i.e. at the input of the electronic DC-DC converter 27) many thermoelectric cells 24 must be connected in series.

According to a possible embodiment, the thermoelectric generator could be able to generate an electrical power high enough to supply all the low voltage electrical loads of the vehicle, and therefore could obviate any need for an alternator generating electrical energy by using part of the mechanical power of the drive shaft. In other words, the thermoelectric generator could completely replace the traditional alternator that generates electrical energy by using part of the mechanical power of the drive shaft.

According to a preferred embodiment, the distance between two adjacent exchanger plates 20 is such that the flow of air is laminar; in this way, the energy efficiency of the thermoelectric cells 24 can be improved. Similarly, the distance between the support turrets of the exchanger plates 20 is such that the flow of air is laminar; in this way, the energy efficiency of the thermoelectric cells 24 can be improved.

The embodiments described herein may be combined with each other without departing from the scope of protection of the present invention.

The intercooler 9 described above has many advantages.

Firstly, the intercooler 9 described above allows high energy efficiency in the generation of electrical energy, as it allows excellent heat transmission from the air coming from the compressor 15 of the turbocharger 13.

In addition, the intercooler 9 described above uses only solid-state thermoelectric cells 24 and therefore is entirely devoid of parts that move and hence subject to wear; consequently, the intercooler 9 described above requires no maintenance and has a very long operating life. In addition, the intercooler 9 described above does not generate acoustic noise or high frequency electrical noise.

The intercooler 9 described above results in an extremely low weight increase with respect to a similar intercooler 9 devoid of thermoelectric cells 24, because in fact the weight increase is due solely to the insertion of the thermoelectric cells 24, and all the other parts of the intercooler 9 described above are also present (possibly with a different conformation) in a similar intercooler 9 devoid of thermoelectric cells 24.

In the intercooler 9 described above, the thermoelectric cells 24 are subjected to relatively limited thermal stresses and therefore do not need to be designed to withstand severe thermal stresses, with considerable savings in costs (in essence, it is possible to use standard "commercial" thermoelectric cells 24 instead of "special" thermoelectric cells 24 having much higher purchase costs). This result is obtained thanks to the fact that the thermoelectric cells 24 are "buried" ("embedded") in the exchanger plates 20, i.e. are inserted in corresponding pockets 25, which, by surrounding the thermoelectric cells 24 on five sides, prevent said thermoelectric cells 24 from heating up too much. The air coming from the compressor 15 of the turbocharger can have a maximum temperature close to 400° C., whereas a standard "commercial" thermoelectric cell 24 can withstand a maximum temperature of about 200° C.; it is therefore necessary to ensure an optimal thermal contact between the thermoelectric cells 24 and the cooling fluid (having a working temperature of 80-90° C.) which flows inside the exchanger plates 25 to prevent the thermoelectric cells 24 from internally exceeding the maximum temperature of about 200° C. even when they are hit by air having a temperature close to 400° C.

Lastly, the intercooler 9 described above has an insignificant size increase compared to a similar intercooler 9 devoid of thermoelectric cells 24, since the total volume of the thermoelectric cells 24 is negligible relative to the overall volume of the cooling chamber 19.

LIST OF REFERENCE NUMBERS IN THE FIGURES 1 heat engine
2 drive shaft
3 cylinders
4 intake manifold
5 exhaust manifold
6 intake pipe
7 air filter
8 throttle valve
9 intercooler
10 exhaust pipe
11 catalyst
12 turbocharger supercharging system
13 turbocharger
14 turbine
15 compressor
16 box-like body
17 inlet opening
18 outlet opening
19 cooling chamber
20 exchanger plates
21 circulation circuit
22 inlet opening
23 outlet opening
24 thermoelectric cells
25 pocket
26 fins
27 electronic DC-DC converter
28 electronic control unit
D air flowing direction

The invention claimed is:

1. An intercooler (9) for a turbocharged internal combustion heat engine (1); the intercooler (9) comprises:
a cooling chamber (19), which is provided with an air inlet opening (17) and an air outlet opening (18) opposite one another;
a plurality of exchanger plates (20), which are stacked on top of one another inside the cooling chamber (19), are internally hollow, are arranged parallel to an air flowing direction (D) from the inlet opening (17) to the outlet opening (18), and are spaced apart from one another to define corresponding air passage channels between one another so that air flowing from the inlet opening (17)

to the outlet opening (18) through the air passage channels to be cooled laps an outer surface of the exchanger plates (20);

a circulation circuit (21), which allows a cooling fluid to circulate inside the exchanger plates (20); and a plurality of thermoelectric cells (24), each of which has a parallelepiped shape, is mounted on a corresponding exchanger plate (20), and has a cold side resting on the exchanger plate (20) and a hot side delimiting a corresponding air passage channel so that air flowing from the inlet opening (17) to the outlet opening (18) through the air passage channel laps an outer surface of the thermoelectric cells (24);

wherein each exchanger plate (20) comprises at least one parallelepipedal pocket (25), which is dug inside the exchanger plate (20), reproduces in negative the shape of a corresponding thermoelectric cell (24) and houses therein the corresponding thermoelectric cell (24) surrounding the corresponding thermoelectric cell (24) on five sides in such a way that the hot side of the corresponding thermoelectric cell (24) is flush with an external surface of the corresponding exchanger plate (20).

2. The intercooler (9) according to claim 1, wherein in each exchanger plate (20) the pocket (25) has a rectangular-shaped bottom wall which is arranged in direct contact with the cold side of the corresponding thermoelectric cell (24) and a side wall, which projects perpendicularly from the bottom wall, surrounds the bottom wall on the four sides, and is arranged in direct contact with a side wall of the corresponding thermoelectric cell (24).

3. The intercooler (9) according to claim 2, wherein in each exchanger plate (20) the pocket (25) has a depth equal to a thickness of the corresponding thermoelectric cell (24) so that the side wall of the corresponding thermoelectric cell (24) is completely covered by the side wall of the pocket (25).

4. The intercooler (9) according to claim 2, wherein the corresponding thermoelectric cell (24) does not protrude from an external surface of the corresponding exchanger plate (20) and is perfectly flush with the external surface of the corresponding exchanger plate (20).

5. The intercooler (9) according to claim 2, wherein the hot side of each thermoelectric cell (24) is aligned and coplanar with an external surface of the corresponding exchanger plate (20).

6. The intercooler (9) according to claim 1, wherein each exchanger plate (20) comprises two rows of thermoelectric cells (24) and a plurality of fins (26), which are interposed between the rows of thermoelectric cells (24) and are arranged parallel to the air flowing direction (D) from the inlet opening (17) to the outlet opening (18).

7. The intercooler (9) according to claim 6, wherein the extent of the fins (26) along the air flowing direction (D) is at least 70% of the extent of the thermoelectric cells (24) in the same air flowing direction (D).

8. The intercooler (9) according to claim 1 and comprising an electronic DC-DC converter (27), which, at the input, is connected to an electrical circuit connecting all the thermoelectric cells (24) and, at the output, provides an electric voltage that is always constant and equal to a predetermined nominal value.

9. The intercooler (9) according to claim 1 and comprising an electronic control unit (28), which changes the equivalent electrical resistance perceived by each thermoelectric cell (24) or by a group of thermoelectric cells (24) electrically connected to one another, so as to pursue an optimal equivalent electrical resistance.

10. An internal combustion engine (1) comprising:
cylinders (3), each of which is connected to an intake manifold (4) and to an exhaust manifold (5);
an intake pipe (6), which feeds fresh intake air to the intake manifold (4);
an exhaust pipe (10), which is connected to the exhaust manifold (5) and feeds exhaust gases produced by combustion to an exhaust system;
turbocharger (13) provided with a turbine (14) arranged along the exhaust pipe (10) and a compressor (15), which is rotated by the turbine (14) and is arranged along the intake pipe (6); and
an intercooler (9), which cools the intake air and is arranged along the intake pipe (6) downstream from the compressor (15);
wherein the intercooler (9) is made according to claim 1.

* * * * *

UNITED STATES PATENT AND TRADEMARK OFFICE
CERTIFICATE OF CORRECTION

PATENT NO. : 10,865,702 B2  
APPLICATION NO. : 16/226083  
DATED : December 15, 2020  
INVENTOR(S) : Nazario Bellato et al.

Page 1 of 1

It is certified that error appears in the above-identified patent and that said Letters Patent is hereby corrected as shown below:

On the Title Page

Item (71) Applicant: delete "MARELLI EUROPE S.p.A." and insert therefor --MARELLI EUROPE S.p.A., Corbetta (IT)--.

Signed and Sealed this  
Ninth Day of November, 2021

Drew Hirshfeld  
*Performing the Functions and Duties of the*  
*Under Secretary of Commerce for Intellectual Property and*  
*Director of the United States Patent and Trademark Office*